United States Patent [19]
Mailho et al.

[11] Patent Number: 6,031,211
[45] Date of Patent: Feb. 29, 2000

[54] ZONE HEATING SYSTEM WITH FEEDBACK CONTROL

[75] Inventors: Robert D. Mailho, Sonora, Calif.;
Douglas S. Schatz, Fort Collins, Colo.

[73] Assignees: Concept Systems Design, Inc.,
Fremont, Calif.; Advanced Energy Industries, Inc., Fort Collins, Colo.

[21] Appl. No.: 08/890,386

[22] Filed: Jul. 11, 1997

[51] Int. Cl.[7] .................................................. H05B 3/02
[52] U.S. Cl. .................... 219/486; 219/656; 219/121.43; 219/121.4; 219/121.52
[58] Field of Search ................. 219/656, 121.43, 219/121.4, 121.52, 121.48, 483, 486, 497; 156/345, 643.1, 646.1; 118/724, 725

[56] References Cited

U.S. PATENT DOCUMENTS

| | | | |
|---|---|---|---|
| 4,160,637 | 7/1979 | Jordan | 425/225 |
| 4,983,804 | 1/1991 | Chan et al. | 219/85.1 |
| 5,068,516 | 11/1991 | Ki-Joon | 219/656 |
| 5,192,849 | 3/1993 | Moslehi | 219/121.43 |
| 5,315,092 | 5/1994 | Takahashi et al. | 219/497 |
| 5,449,883 | 9/1995 | Tsuruta | 219/483 |
| 5,578,165 | 11/1996 | Patrick et al. | 156/643.1 |

FOREIGN PATENT DOCUMENTS

| | | |
|---|---|---|
| 0 293 021 | 11/1988 | European Pat. Off. . |
| 0 426 350 | 5/1991 | European Pat. Off. . |
| 678 251 | 8/1991 | Switzerland . |
| 1 570 916 | 7/1980 | United Kingdom . |
| 94/17353 | 8/1994 | WIPO . |

*Primary Examiner*—Mark Paschall
*Attorney, Agent, or Firm*—Skjerven, Morrill, MacPherson, Franklin & Friel, LLP

[57] ABSTRACT

A structure and method are disclosed which allow for a tighter control of the temperature across a wafer substrate. In accordance with the present invention, a wafer to be processed is heated to a constant and uniform temperature by an RF induction coil including a plurality of heating zones each of which being shunted by an associated capacitor tuned to a specific frequency. By adjusting the time during which current of a particular frequency is provided to the induction coil, current flow within, and thus the heat generated in, each of the zones may be independently controlled. Since the heat generated in the susceptor quickly changes in response to changes in current flow therein, both deviations of the wafer temperature from the processing temperature and temperature gradients across the surface of the wafer may be quickly corrected. This superior thermal response results in the present invention maintaining a wafer at a uniform temperature during heating and cooling with increased accuracy and precision.

21 Claims, 5 Drawing Sheets

ZONE HEATING SYSTEM WITH FEEDBACK CONTROL

BACKGROUND OF THE INVENTION

1. Field of the Invention

This invention relates to heating systems for use in semiconductor processing equipment and in particular to a heating system for use in a chemical vapor deposition system for forming layers of materials on semiconductor wafers.

2. Description of Related Art

Equipment for the formation of layers, such as epitaxial silicon or polysilicon, on semiconductor wafers is well known. One of the problems in forming layers of materials on a semiconductor wafer is ensuring that the temperature of the semiconductor wafer is kept uniform across the wafer during the deposition process, i.e., during heat-up, processing, and cool-down. Since the deposition rate of a layer of material upon the wafer is dependent on the temperature of the wafer, any temperature variations between the center and edge of a wafer will undesirably result in the deposition of a layer of non-uniform thickness on the wafer. In addition, non-uniform temperatures during heat-up, processing, or cool-down can cause stress on the wafer, undesirably resulting in slip. Accordingly, it is important during the deposition of a layer of material on a silicon wafer to minimize temperature variations across the surface of the wafer.

Some earlier systems developed to achieve temperature uniformity across a wafer teach applying heat in a uniform manner across all portions of a wafer. However, since heat loss is typically greater at the edge of a wafer than at the center, such earlier systems may result in significant temperature differences between the center and outer portions of the wafer and, thus, may be largely ineffective in minimizing temperature gradients across the surface of a wafer.

Some more recent heating schemes employ lamp assemblies having heating lamps arranged in a plurality of independently controlled zones to allow differing amounts of heat to be applied to the outer and center portions of the wafer. In this manner, variations of heat loss on a wafer can be compensated by applying differing amounts of heat to various portions of the wafer in order to achieve greater temperature uniformity across the wafer. Such techniques are typically able to maintain temperature differences of less than 10° C.

The heating lamps employed in such multiple-zone heating assemblies may result in several disadvantages. Each of these lamps, which is typically tungsten halogen, has a finite useful life and thus must be periodically replaced. The replacement of such lamps, as well as periodic adjustment of the lamps due to their aging, not only increases manufacturing costs but also decreases the throughput of the chemical vapor deposition (CVD) system.

Furthermore, the use of such heating lamps in a radiantly heated CVD system undesirably requires periodically cleaning the quartz walls of the reaction chamber to remove deposited material from the chamber walls. Recall that since the walls in a lamp heated CVD reaction chamber become heated, layers of material deposit not only on the wafer but also on the chamber walls. The resultant film formed on the chamber walls then absorbs some of the radiant energy emitted from the heating lamps and thereby locally increases the temperature of the chamber walls. As a result, layers of material deposit on the chamber walls at an increasing rate, thereby creating a "snowball" effect.

It is therefore critical, in a lamp heated CVD chamber, that the walls be kept meticulously clean. This requires that the walls be etched frequently, sometimes even after every run. Cleaning the walls typically takes between 2 to 4 minutes after depositing an epitaxial layer, and longer after depositing polysilicon. Since the entire cycle time in warm wall CVD systems may be between 5–10 minutes, cleaning the walls accounts for a significant portion of the cycle time and, therefore, severely reduces throughput of the CVD system.

Accordingly, it is desirable to provide a heating system for chemical vapor deposition which uniformly and precisely heats a semiconductor wafer without the above-mentioned deficiencies.

SUMMARY

A structure and method are provided which allow for a more precise control of the temperature across a wafer substrate. In accordance with the present invention, a wafer to be processed is heated within a reaction chamber to a uniform temperature by one or more radio frequency (RF) induction coils, each having a plurality of independently controlled heating zones. Different zones of the reaction chamber require different amounts of heat energy to provide uniform temperature to the wafer. The heat generated by each of the independently controlled zones is controlled by a control circuit which, in response to feedback signals indicative of the temperature of various portions of the wafer or reaction chamber, adjusts power provided to each of the independently controlled zones of the one or more induction coils. In this manner, the wafer may be heated and cooled at a uniform rate across the wafer and maintained at a uniform temperature.

Furthermore, by eliminating conventional heating lamps, the RF induction heating system in the present invention eliminates problems associated with such devices. For instance, lamp failure and replacement are no longer concerns. In addition, embodiments of the present invention do not require the periodic meticulous cleaning of the chamber walls to remove films of material deposited thereon. The field created by the induction coils agitates electrons within an associated graphite susceptor within the reaction chamber. This graphite susceptor, in turn, heats the wafer. Thus, heat energy does not pass through the quartz walls. Accordingly, since heat transferred to the wafer is independent from the thickness of deposited layers formed on the walls of the reaction chamber, the chamber walls of the present invention do not require the frequent and meticulous cleaning required by conventional lamp heated CVD systems.

BRIEF DESCRIPTION OF THE DRAWINGS

Use of the same reference numbers in different figures indicates like or similar elements.

DETAILED DESCRIPTION

A method and structure is provided using independently controlled heating zones within radio frequency (RF) induction coils along with a feedback control system to heat and cool a semiconductor wafer at a substantially uniform rate and to maintain the wafer at a substantially constant and uniform temperature. The present invention is described below in the context of one particular embodiment, with reference to FIGS. 1–4 for clarity. It is to be understood, however, that the description below is merely illustrative and should in no way be construed as limited to the specific examples discussed herein.

Figure 1:
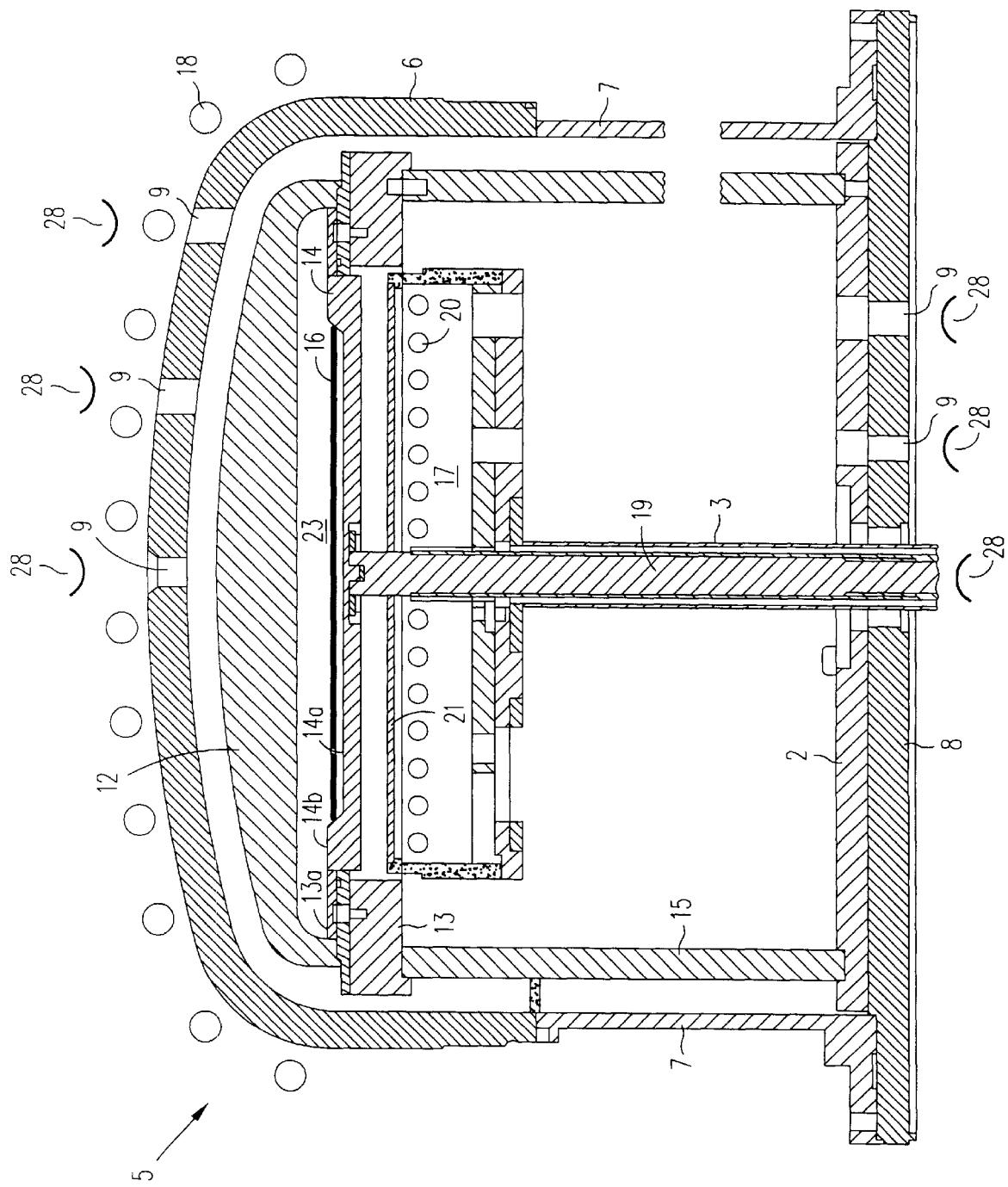
FIG. 1 is a diagram of a reactor including portions of a heating system according to an embodiment of the present invention.

In FIG. 1, a chemical vapor deposition (CVD) reactor 5 is shown, which includes a bell jar 6, side walls 7, and a base 8, where bell jar 6 is preferably opaque quartz and base 8 is preferably stainless steel. A chamber top 12, a spacer ring 13 with a ring plate 13a, an inner housing 15, and base-liner 2 lie within the structure formed by elements 6, 7, and 8. A pedestal 3 supports a coil housing 17, which includes a silicon carbide plate 21 located between a lower coil 20 housed therein and a susceptor 14. Susceptor 14 holds a wafer 16 between a chamber top 12 and susceptor 14, both of which are preferably silicon-carbide coated graphite. A shaft assembly 19 contained within pedestal 3 rotates susceptor 14 and wafer 16. A detailed description of shaft assembly 19 is provided in commonly-owned U.S. pat. app. Ser. No. 08/979,741, entitled "Susceptor Hold-down Mechanism", filed Nov. 26, 1997 and bearing attorney docket No. M-4812, which is incorporated by reference herein in its entirety. Remaining elements of FIG. 1 include temperature sensors 28 and an upper coil 18 located about the periphery of bell jar 6.

The top surface of susceptor 14 has a recessed portion 14a such that the surface of wafer 16 has minimum contacts with susceptor 14, thereby minimizing conductive heat transfer between susceptor 14 and wafer 16. When resting on susceptor 14, the bottom surface of wafer 16 is approximately 0.01 inches above the top surface of recessed portion 14a of susceptor 14. The top surface of wafer 16 should be substantially flush with an unrecessed top surface 14b of susceptor 14 so that chamber top 12, ring plate 13a, susceptor 14, and wafer 16 form a parallel-plate shaped reaction chamber 23. For example, in some embodiments the top surface of wafer 16 can be within ±80 mils of the top surface 14b of susceptor 14 and be considered substantially flush. The inner surface of chamber top 12 should be approximately ½ to ⅜ of an inch from wafer 16 in order to maximize deposition rates on wafer 16. Together, chamber top 12 and susceptor 14, via upper and lower coils 18 and 20, respectively, heat wafer 16 contained within.

Power is applied to induction coils 18 and 20, which transfers RF energy to chamber top 12 and susceptor 14, respectively. This heats chamber top 12 and susceptor 14, which heats wafer 16 via the silicon carbide coating on chamber top 12 and susceptor 14 serving as heat conductors.

Figure 2A:
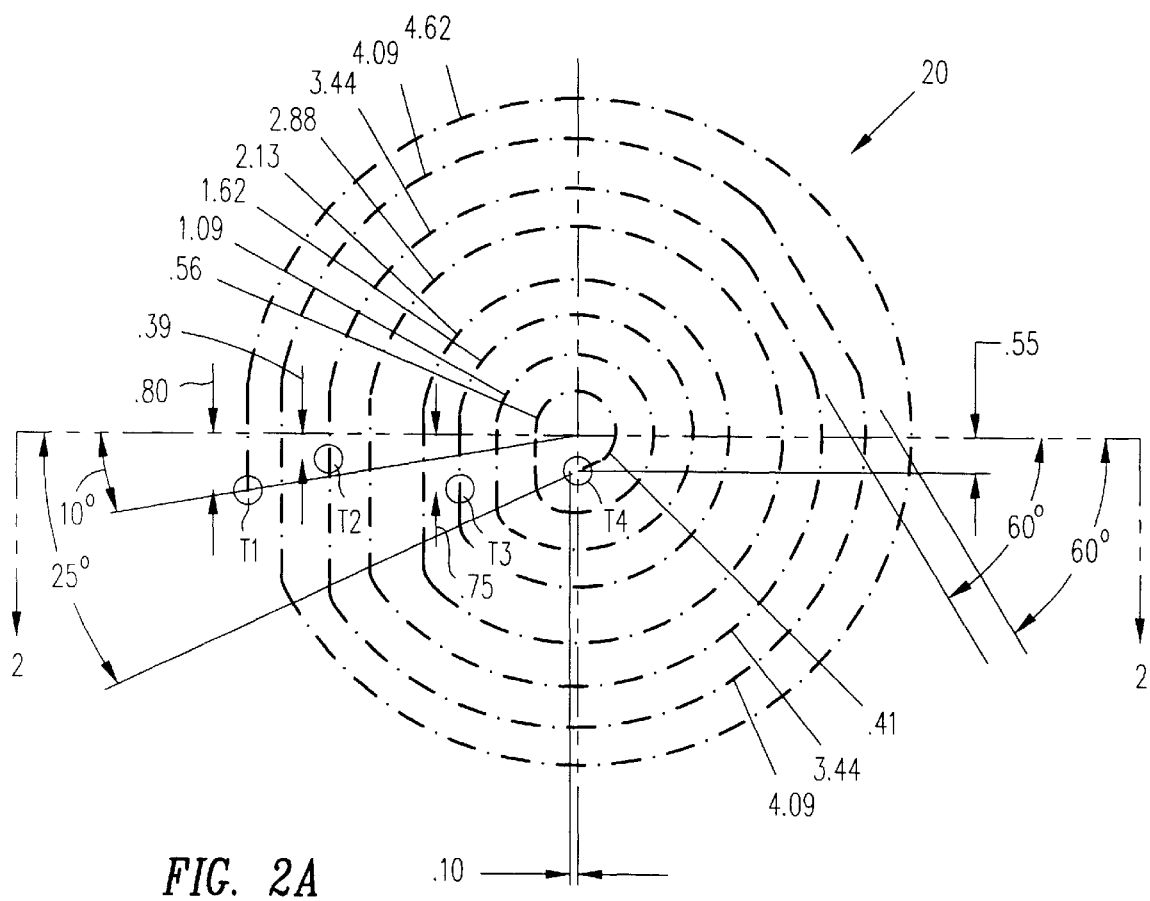
FIGS. 2A and 2B are sectional views of a lower RF induction coil for an embodiment of the present invention.
Figure 2B:
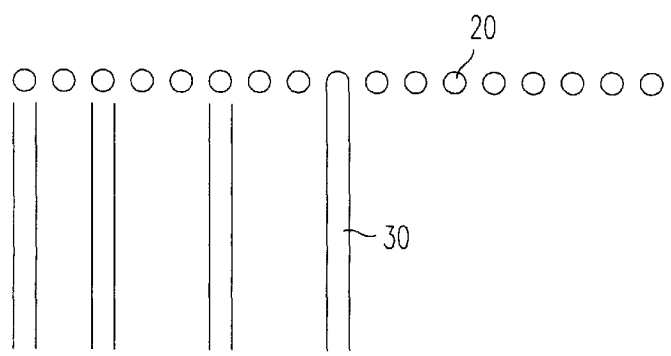

Lower coil 20 is a continuous coil positioned immediately below susceptor 14. Lower coil 20 is preferably a 5/16 inch copper tube formed in an eight-turn spiral configuration and having an inner radius of approximately 0.56 inches and an outer radius of approximately 4.62 inches, with approximate values for various radii given in inches in FIG. 2A. In the present embodiment, lower coil 20 has a single layer, as shown in FIG. 2A (top view) and FIG. 2B (side view of FIG. 2A along sectional lines 2—2 ). FIG. 2A also shows lower coil 20 with four taps $T_1$–$T_4$ connected at various points along lower coil 20, where taps $T_1$ and $T_2$ define an outer segment, taps $T_2$ and $T_3$ define an intermediate segment, and taps $T_3$ and $T_4$ define an inner segment. Each of the segments of lower coil 20 are associated with concentric outer, intermediate, and inner zones of susceptor 14. Tap tubes 30, also preferably 5/16 inch copper, are connected to each tap for providing power and water to the individual coil segments, as shown in FIG. 2B.

Figure 3A:
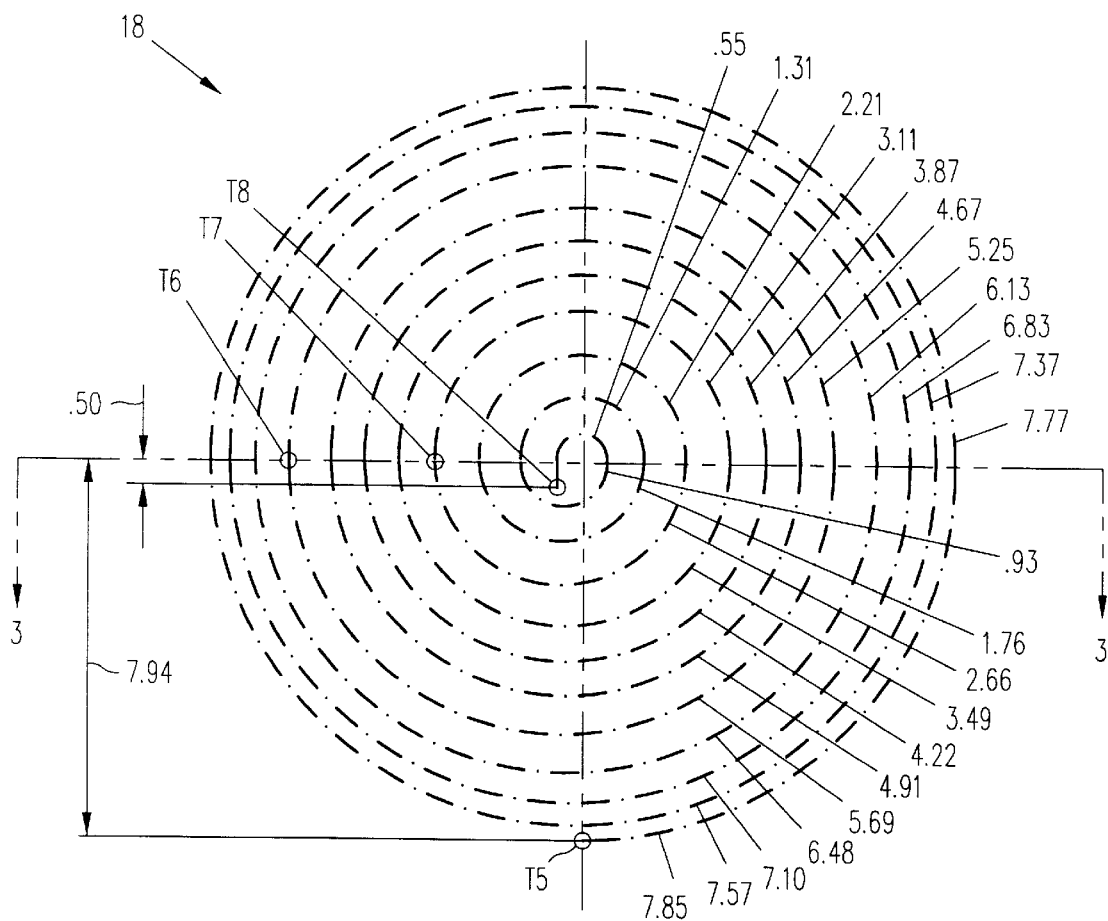
FIGS. 3A–3C are sectional views of an upper RF induction coil for an embodiment of the present invention.
Figure 3C:
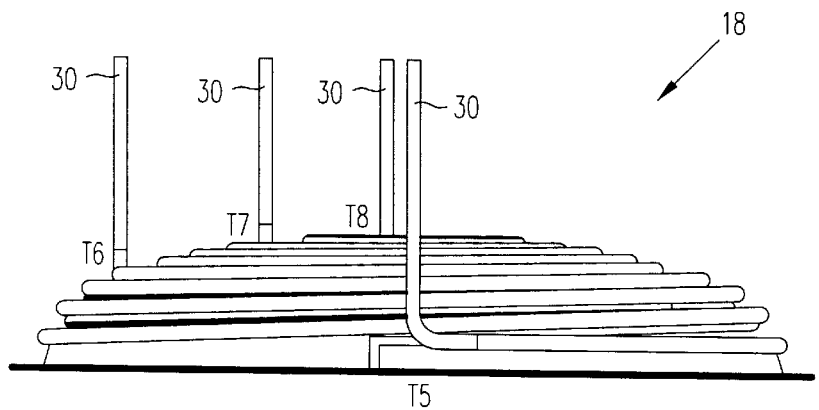
Figure 3B:
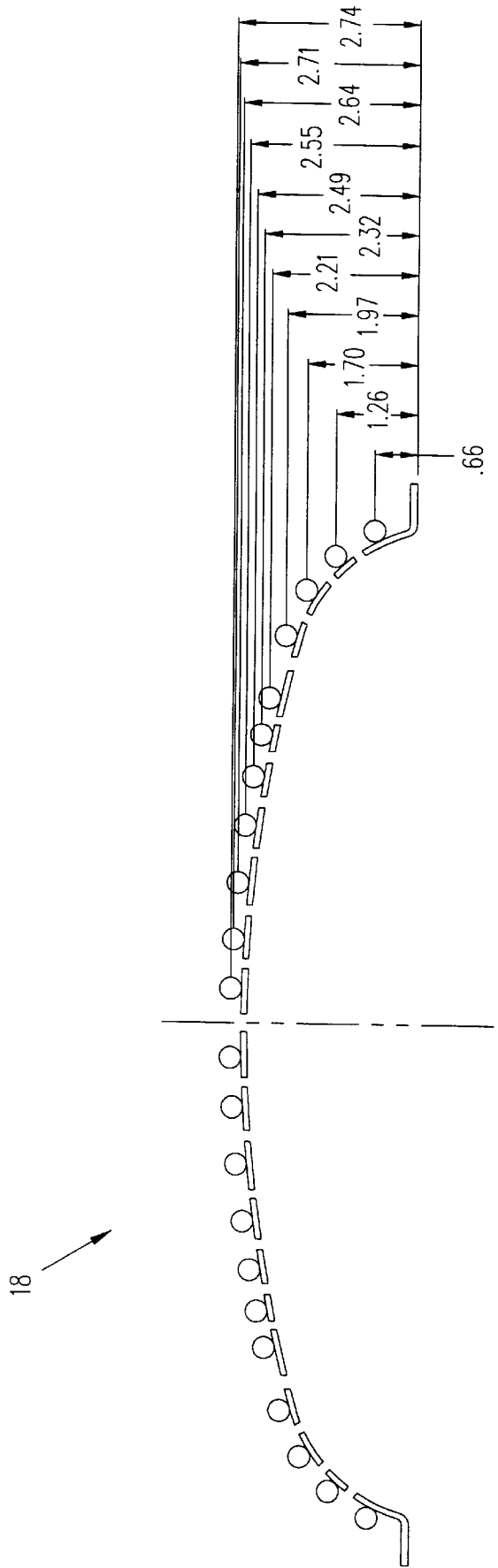

Upper coil 18 is a continuous coil positioned immediately above chamber top 12. Upper coil 18 is preferably a 5/16 inch copper tube formed in an eleven-turn spiral configuration having an inner radius of approximately 0.55 inches and an outer radius of approximately 7.94 inches, with various values for other radii in inches shown in FIG. 3A. Upper coil 18 has a single layer and conforms to the shape of chamber top 12, as shown in FIG. 3A (top view) and FIG. 3B (side view along sectional lines 3—3 ), with FIG. 3B showing approximate heights along the diameter of upper coil 18. Four taps $T_5$–$T_8$ are connected at various points along upper coil 18, where taps $T_5$ and $T_6$ define an outer segment, taps $T_6$ and $T_7$ define an intermediate segment, and taps $T_7$ and $T_8$ define an inner segment, as shown in FIG. 3A. FIG. 3C shows tap tubes 30, preferably 5/16 inch copper, connected to taps $T_5$–$T_8$, which supply power and water to each of the segments, associated with concentric outer, intermediate, and inner zones of chamber top 12.

Figure 4:
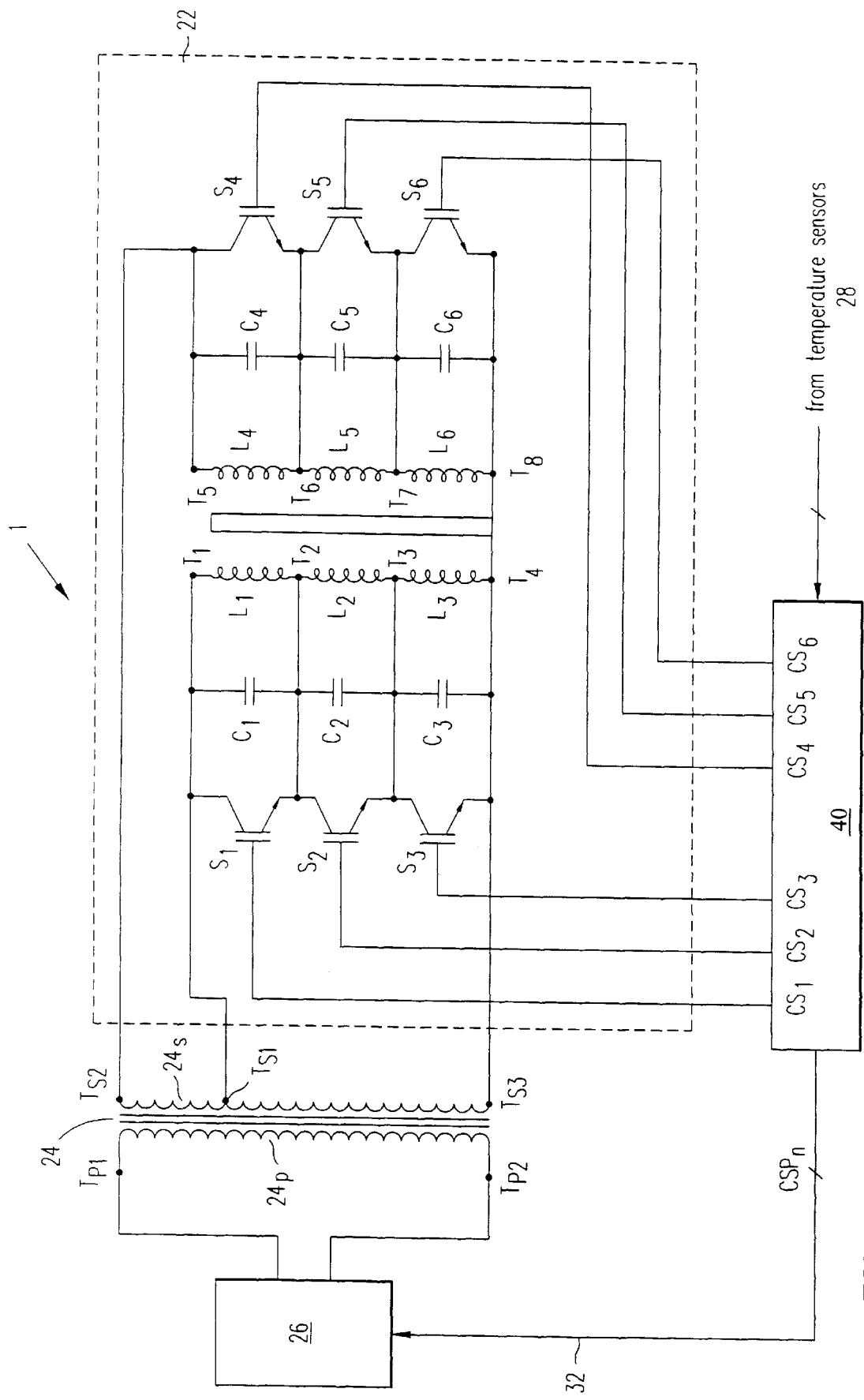
FIG. 4 is a schematic diagram of a control system of the reactor of FIG. 1.

FIG. 4 shows a schematic diagram of a heating system 1, which includes a portion of reactor 5. Inductors $L_1$, $L_2$, and $L_3$ schematically represent the inductances of the outer, intermediate, and inner segments of lower coil 20, with taps $T_1$–$T_4$ separating the three lower segments as shown. In a similar manner, inductors $L_4$, $L_5$, and $L_6$ schematically represent the inductances of the outer, intermediate, and inner segments of upper coil 18, with taps $T_5$–$T_8$ separating the three upper segments. Half of wafer 16 is shown between the schematic representations of the upper and lower coils. Six capacitors $C_1$–$C_6$ and six switching devices $S_1$–$S_6$ (shown as NPN transistors) are connected in parallel across associated ones of inductors $L_1$–$L_6$, thereby creating a resonant tank circuit 22. Switches $S_1$–$S_6$ are preferably insulated gate bipolar transistors (IGBTs), although in other embodiments silicon-controlled rectifiers (SCRs) may be used.

System 1 includes an impedance matched (Z-match) transformer 24 consisting of a primary winding 24p having taps $T_{p1}$ and $T_{p2}$ and a secondary winding 24s having taps $T_{s1}$, $T_{s2}$, and $T_{s3}$. Transformer 24 is selected to match the impedance of resonant tank circuit 22. Tap $T_1$ of lower coil 20 is electrically connected to secondary 24s winding at tap $T_{s1}$ tap $T_5$ of upper coil 18 is electrically connected to secondary winding 24s at tap $T_{s2}$, and taps $T_4$ and $T_8$ are electrically coupled to secondary winding 24s at tap $T_{s3}$. Taps $T_{p1}$ and $T_{p2}$ of primary winding 24p are electrically connected to the output terminals of a power supply 26.

Control circuit 30 provides a plurality of control signals $CSP_n$ to power supply 26 and also provides a plurality of control signals $CS_1$–$CS_6$ to associated ones of switches $S_1$–$S_6$. Power supply 26 is preferably configured to receive power from a standard 60 Hz, 120 volt supply and to provide at its output terminals an AC power which may range in voltage from 0 to 400 V at a frequency of 50 kHz. Power supply 26 provides a current $I_p$ through primary winding 24p which, in turn induces a current flow $I_s$ through secondary winding 24s.

After determining the inductances of each of the segments of upper and lower coils 18 and 20, represented by inductors $L_4$–$L_6$ and $L_1$–$L_3$ respectively, appropriate values for each of capacitors $C_1$–$C_6$ are calculated using the equation below.

These capacitances result in each of the capacitor-inductor pairs corresponding to the segments of lower coil 20 and of upper coil 18 resonating at a frequency $f_o$ of 50 kHz, the frequency provided by power supply 26.

$$f_o = \frac{1}{2\pi\sqrt{LC}}$$

As seen from this equation, for a set frequency, increasing the inductance decreases the capacitance, thereby reducing capacitor sizes. The inductances $L_1$–$L_6$ associated with each of six segments of susceptor 14 and chamber top 12 can be increased by forming more turns in lower coil 20 and upper coil 18, respectively. Consequently, inductances of individual segments in a single layer coil can be selectively increased by forming additional layers over the individual segments, resulting in a decrease in capacitor size and an increase in coupling to susceptor 14, chamber top 12, and other parts of reactor 5.

The conductive states of switches $S_1$–$S_6$ are controlled by the logic states of associated control signals $CS_1$–$CS_6$ from control circuit 30. Control circuit 30 manipulates control signals $CS_1$–$CS_6$ so that power is supplied sequentially from the outer to the inner segment of lower coil 20 and then from the outer to the inner segment of upper coil 18 during each cycle of a system clock. A clock signal is generated in a known manner using, for instance, a conventional oscillator having an internal phase-locked loop (PLL) circuit. In the present embodiment, the clock frequency is equal to 60 Hz so that every 16 milliseconds, power is supplied to one of the zones of coils 18 or 20.

For instance, in one embodiment, during a first portion of a clock cycle, control signal $CS_1$ is in a logic low state and results in switch $S_1$ being open, i.e., non-conducting, and control signals $CS_2$–$CS_6$ are in a logic high state and result in switches $S_2$–$S_6$ being closed, i.e., conducting. Thus, the current $I_s$ induced in secondary winding 24s flows through the resonant circuit formed by capacitor $C_1$ and inductance $L_1$, switches $S_2$ and $S_3$, and back to secondary winding 24s. Since capacitors $C_2$–$C_6$ are effectively shorted, the current $I_s$ flows only through the resonant circuit formed by capacitor $C_1$ and inductance $L_1$.

During a second portion of the clock cycle, control signal $CS_1$ transitions high, control signal $CS_2$ transitions low, and control signals $CS_3$–$CS_6$ remain in a logic high state. Thus, switch $S_1$ closes, switch $S_2$ opens, and switches $S_3$–$S_6$ remain closed. The current $I_s$ ceases to flow through capacitor $C_1$ and now flows from tap $T_{s1}$ to tap $T_{s3}$ through the resonant circuit formed by capacitor $C_2$ and inductance $L_2$ and through switches $S_1$ and $S_3$. Meanwhile, any energy stored in capacitor $C_1$ is dumped into switch $S_1$, and any current flowing in inductance $L_1$ is shunted away from capacitor $C_1$ by the closed switch $S_1$. The current in inductance $L_1$ is composed of an exponential decay current, which is the decay of any residual current that may have been flowing in inductance $L_1$ at the time switch $S_1$ is closed, and an induced oscillatory current, which is due to the mutual coupling between inductances $L_1$ and $L_2$. The induced current will produce a magnetic field, which will heat the outer zone of susceptor 14, as well as switch $S_1$ itself. This effect can be greatly reduced if the susceptor were close to the coils, since most of the energy in the magnetic field of inductance $L_2$ would dissipate in the susceptor and thus would not be linked into inductance $L_1$. So, for this type of power switching, the susceptor should be close to the coils so that mutual coupling between coil sections is minimized. The discharging of capacitor $C_1$ thus induces a current flow through the outer segment of lower coil 20 to create a magnetic field having flux lines which intercept the outer zone of susceptor 14. These flux lines induce eddy currents within the outer zone of susceptor 14. The resultant flow of electrons back and forth within the outer zone of susceptor 14 generates heat energy which is emitted from the outer zone towards a corresponding outer portion of wafer 16.

The magnetic field created by the turns within the outer segment of lower coil 20 greatly decreases when moving along the diameter and towards the center of lower coil 20. Thus, although the flux lines generated by the outer segment of lower coil 20 also intercept portions of susceptor 14 lying within the intermediate zone, the resultant eddy currents induced in the intermediate zone are one or more orders of magnitude less than those eddy currents induced within the outer zone. As a result, during this first portion of the clock cycle, heat energy is generated substantially in the outer zone of susceptor 14.

This above-described process is repeated until the current $I_s$ is provided to each of the six segments of lower 20 and upper 18 coils in a sequential fashion, thereby resulting in heat energy being generated sequentially in the outer to inner zone of susceptor 14 and then in the outer to inner zone of chamber top 12. In this manner, heat energy is first directed from beneath wafer 16 towards an outer portion of wafer 16. Heat is next directed from beneath wafer 16 towards an intermediate portion of wafer 16, and so on until heat energy is directed from above wafer 16 via the inner zone of chamber top 12 towards a corresponding inner portion of wafer 16. Some of the zones may reach 2,000 volts and 2,000 amperes. Because the inductive heating circuits are high voltage, high current circuits, water flows through tab tubes described above and into upper and lower coils 18 and 20 to cool them and the taps associated with each coil. Furthermore, power consumption and transient time are minimized by maintaining chamber top 12 at 1100° C. and not letting susceptor 14 drop below 800° C. during loading and unloading of wafer 12. As such, high power is required only during temperature ramp-up for susceptor 14 from 800° C. to 1100° C. The time and power required to raise the temperature to a wafer process temperature and the power required to maintain the process temperature are therefore reduced. For example, a wafer can be heated from 800° C. to 1100° C. in approximately 30 seconds using 60–80 kW of power and maintained at that temperature with approximately 20 kW.

In other embodiments in accordance with the present invention, instead of using switches to selectively supply power to the individual zones, a frequency agile power supply for frequency sweeping can be used. Each of capacitors $C_1$–$C_6$ can be tuned to a specific frequency. As a result, resonant circuit 22 may be configured so that each of the coil segment-capacitor pairs $L_n/C_n$ resonate at a different frequency. In response to the control signals $CSP_n$ provided by control circuit 30, power supply 26 sweeps the frequency of the input waveform on a 60 Hz cycle, i.e., once every 16 milliseconds. In one embodiment, power supply 26 varies the frequency of the current waveform, holding the frequency at each of six tuned frequencies $f_1$–$f_6$ corresponding to respective capacitors $C_1$–$C_6$ for durations $t_1$–$t_6$, respectively.

Thus, for instance, if the instantaneous frequency of the current waveform is higher enough than the frequency $f_1$ to which capacitor $C_1$ is tuned, capacitor $C_1$ will provide a low-impedance current path between taps $T_1$ and $T_2$ and thereby shunt the outer segment of lower coil 20 for a time $t_1$. If, on the other hand, the frequency of the current waveform is much lower than the frequency $f_1$ to which the $L_1/C_1$ pair is tuned, the inductance $L_1$ will provide a low impedance path and shunt the current around the outer segment in a similar manner to the high frequency case. Only if the instantaneous frequency is equal to tuned frequency $f_1$, will the current multiplying effect of the resonance of the $L_1/C_1$ pair take effect, building up the current and causing significant heat energy to be generated in the outer zone of susceptor 14 for a time $t_1$. In other words, current is provided to, and thus heat is generated in, the outer zone of susceptor 14 only when the current supplied by power supply 26 is a waveform of frequency $f_1$.

In this manner, the heat generated in each of the zones of susceptor 14 and of chamber top 12 may be controlled so as to achieve temperature uniformity across the surface of wafer 16 by manipulating the frequency and time of the current provided by power supply 26. Note that in such embodiments, switches $S_1$–$S_6$ may remain open or, in some embodiments, eliminated from resonant tank circuit 22.

Using these or other suitable methods to supply power to the individual zones, two single coils having multiple taps positioned at various intervals thereof can heat different portions of a wafer by controlling the time period during which power is applied to each of the segments of the upper and lower coils. Thus, the non-uniformity of heat loss from a wafer may be compensated by adjusting the relative durations of power supplied to each of the six zones. A feedback system utilizing six temperature sensors 28 provides information to control circuit 30 for adjusting the power supplied to each zone.

Referring back to FIG. 1, a plurality of temperature sensors 28 are positioned about the periphery of reactor 5. In the present embodiment, three sensors 28 are located above clear quartz windows 9 in bell jar 6, two sensors 28 are located below clear quartz windows 9 in base 8, and one sensor 28 is located below tube 3. Each sensor 28 measures the temperature between a section of coil 18 or 20 associated with a particular zone, so that six sensors 28 are needed for temperature measurements of the three zones of chamber top 12 and the three zones of susceptor 14. Temperature sensors 28 may be any suitable "contactless" temperature sensing devices such as optical pyrometers for use in conventional temperature control systems.

In FIG. 4, each of temperature sensors 28 is connected to an input terminal of control circuit 30 to provide information indicative of the temperature of associated portion of susceptor 14 and chamber top 12, which is then used by control circuit 30 to determine temperature fluctuations across susceptor 14 and chamber top 12. Control circuit 30 then adjusts control signals $CSP_n$ and $CS_1$–$CS_6$ accordingly to provide a uniform heating and cooling rate and to maintain a precise and uniform temperature across susceptor 14 and chamber top 12. Each sensor 28 has an associated independent control loop to compensate for temperature variations. Each independent control loop adjusts for temperature variations within its associated zone, independent of measurements from the other zones. For example, if each sensor 28 measured the temperature in its zone at 100° C., and it is desired that each zone reach 200° C. in ten seconds, each control loop would supply the necessary control signals to heat the associated zone at a rate of 10° C./sec. Each sensor 28 then monitors the temperature of its associated zone and supplies necessary control signals to maintain the desired temperature. These types of feedback loops are well known in the field.

Thus, in response to these temperature readings, control circuit 30 adjusts the amount of time that current, and therefore power, is supplied to each zone of lower coil 20 or upper coil 18. If switches are used to selectively supply power to zones, control circuit 30 adjusts the relative portions of each clock cycle during which each of control signals $CS_1$–$CS_6$ are low which, as explained above, are adjusted to alter the amount of heat energy generated in each of the zones of susceptor 14 and of chamber top 12. On the other hand if frequency sweeping is used to select desired zones, control circuit 30 determines the time durations $t_1$–$t_6$ and frequency $f_1$–$f_6$ of the respective current waveforms and the power levels thereof required to maintain susceptor 14 and chamber top 12 at a constant and uniform processing temperature. Thus, by manipulating the duration and destination of each input waveform, control circuit 30 controls the current flow within, and thus the heat generated in, each zone of susceptor 14 and chamber top 12. Consequently, system 1 not only has the ability to increase and decrease the temperature of wafer 16 in a uniform manner, but also to maintain wafer 16 at a constant and uniform temperature. By having the ability to change the power level every 16 milliseconds, control circuit 30 can maintain an accuracy of up to approximately ±½° C. on the temperature of susceptor 14 or chamber top 12. Conventional control algorithms may be employed to ensure that power provided to each of the zones of upper and lower coils 18 and 20 is allotted so as to result in raising and lowering the temperature of wafer 16 in a uniform manner, maintaining wafer 16 at a constant and uniform temperature during processing, and cooling wafer 16 in a uniform manner.

By allowing a quick and uniform temperature decrease in the temperature of wafer 16, system 1 of the present invention also reduces slip problems associated with temperature gradients. Immediately after processing, wafer 16, susceptor 14, and chamber top 12 are approximately at the same temperature, i.e., the reaction temperature, which can be 1100° C. or higher. As susceptor 14 is cooled from 1100° C. to 800° C. to unload wafer 16, outer portions of susceptor 14 and wafer 16 radiate heat at greater rates than do their inner portions. Therefore, the temperature control system described above compensates for the non-uniformity by applying more heat to the outer portions, thereby facilitating a uniform cooling of wafer 16. As the temperature of wafer 16 approaches approximately 800° C., slip problems become much less significant. During the cooling process, heat is conductively transferred from wafer 16 to susceptor 14, which in turn transfers heat to lower coil 20. This heat is then dispersed to the water circulating within lower coil 20. In this manner, wafer 16 may be cooled from a reaction temperature of approximately 1100° C. to a wafer unload temperature of 800° C. in less than one minute.

Thus, in the present embodiment, the switching system used effects nearly instantaneously changes in current flow through the segments of lower coil 20 and of upper coil 18 in response to changes in the current waveform. The heat generated in each of the segments of susceptor 14 and chamber top 12 by the coils quickly changes in response to changes in the current flowing therein. The resulting superior thermal response of susceptor 14 and chamber top 12 allows heating system 1 to effect rapid temperature changes in the respective inner, intermediate, and outer portions of wafer 16. The ability of heating system 1 to more quickly correct any temperature deviations in wafer 16 increases the precision with which wafer 16 may be held at a constant and uniform processing temperature.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the true spirit and scope of this invention.

What is claimed is:

1. A system for heating a substrate comprising:
   a first heating element comprising a radio frequency induction coil having a plurality of zones, wherein each of said plurality of zones is powered individually to heat associated portions of said substrate; and
   a plurality of capacitors each being connected in parallel with an associated one of said plurality of zones in said coil.

2. The system of claim 1, further comprising a second heating element wherein said substrate is located between said first and second heating elements.

3. The system of claim 2, wherein said second heating element comprises a second induction coil having a plurality of individually powered zones.

4. The system of claim 1, further comprising:
   a plurality of temperature sensors positioned proximate to said substrate, each of said sensors measuring the temperature of an associated portion of said substrate and corresponding to one of said zones; and
   a control circuit coupled between said zones and said sensors, said control circuit altering an amount of time said power is supplied to each of said zones in response to said measurements from at least one of said plurality of sensors.

5. A system for heating a substrate comprising:
   a first heating element comprising a radio frequency induction coil having a plurality of zones;
   a power generator coupled to said heating element, said power generator providing power individually to each of said plurality of zones to heat associated portions of said substrate; and
   a plurality of capacitors each being connected in parallel with an associated one of said plurality of zones in said coil.

6. The system of claim 5, wherein said power generator comprises an RF current source.

7. The system of claim 5, further comprising:
   a plurality of temperature sensors positioned proximate to said substrate, each of said sensors measuring the temperature of an associated portion of said substrate and corresponding to one of said zones; and
   a control circuit coupled between said power generator and said sensors, said control circuit altering an amount of time said power is supplied to each of said zones in response to said measurements from at least one of said plurality of sensors.

8. The system of claim 5, further comprising a plurality of switches, each connected to one of said zones.

9. The system of claim 8, wherein said switches are insulated gate bipolar transistors.

10. The system of claim 8, wherein said switches are silicon-controlled rectifiers.

11. The system of claim 18, wherein said control system causes said power generator to supply power sequentially to said plurality of zones.

12. The system of claim 5, wherein said power generator provides from an outer one to an inner one of said plurality of zones to heat associated portions of said substrate from a corresponding outer portion to inner portion.

13. The system of claim 5, wherein said plurality of capacitors are each tuned to a different frequency.

14. The system of claim 5, wherein said plurality of zones heats associated outer portions of said substrate more than associated inner portions of said substrate when said substrate is being cooled.

15. A system for heating a substrate comprising:
   a first heating element comprising a radio frequency induction coil having a plurality of zones;
   a plurality of power generators, wherein each one of said plurality of generators is coupled to each one of said plurality of zones to provide power individually to each of said plurality of zones to heat associated portions of said substrate; and
   a plurality of capacitors each being connected in parallel with an associated one of said plurality of zones in said coil.

16. A method of heating a substrate comprising:
   dividing a radio frequency (RF) induction coil into a plurality of zones; and
   switching power from an outer one of said zones to an inner one of said zones to heat associated portions of said substrate from an outer portion to an inner portion.

17. The method of claim 16, further comprising the steps of:
   measuring temperatures corresponding to each portion of said substrate associated with each of said zones; and
   altering an amount of time said power is supplied to each one of said zones in response to at least one of said temperature measurements.

18. The system of claim 5, further comprising a control system to permit said power generator to supply power selectively to said plurality of zones.

19. The method of claim 16, further comprising tuning a plurality of capacitors connected in parallel to corresponding ones of said plurality of zones each to a different frequency.

20. The method of claim 19, further comprising periodically sweeping through said different frequencies.

21. The method of claim 16, further comprising heating an outer portion of said substrate more than an inner portion of said substrate when said substrate is being cooled.

* * * * *